US012769201B2

(12) United States Patent
Huang et al.

(10) Patent No.: US 12,769,201 B2
(45) Date of Patent: Oct. 20, 2026

(54) SELECTIVE HARDMASK ON HARDMASK

(71) Applicant: Taiwan Semiconductor Manufacturing Company, Ltd., Hsinchu (TW)

(72) Inventors: Kuan-Da Huang, Hsinchu (TW); Chun-Fu Kuo, Kaohsiung (TW); Yi Hsing Yu, Hsinchu (TW); Li-Te Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 916 days.

(21) Appl. No.: 18/165,759

(22) Filed: Feb. 7, 2023

(65) Prior Publication Data

US 2024/0168371 A1 May 23, 2024

Related U.S. Application Data

(60) Provisional application No. 63/384,676, filed on Nov. 22, 2022.

(51) Int. Cl.
*G03F 1/68* (2012.01)
*G03F 1/48* (2012.01)
(Continued)

(52) U.S. Cl.
CPC .................. *G03F 1/68* (2013.01); *G03F 1/48* (2013.01); *G03F 7/0043* (2013.01); *G03F 7/075* (2013.01); *H10P 50/242* (2026.01)

(58) Field of Classification Search
CPC . G03F 1/68; G03F 1/48; G03F 7/0043; G03F 7/075; H10P 50/242; H10P 50/268;
(Continued)

(56) References Cited

U.S. PATENT DOCUMENTS 7,923,374 B2 4/2011 Sakamoto et al.
9,576,812 B2 2/2017 Franke et al.
(Continued)

FOREIGN PATENT DOCUMENTS

TW 200308002 A 12/2003
TW 201705268 A 2/2017
TW 202242953 A 11/2022

*Primary Examiner* — Caleen O Sullivan
(74) *Attorney, Agent, or Firm* — Ingrassia Fisher & Lorenz, LLP | IF&L

(57) ABSTRACT

Disclosed is a method of manufacturing a semiconductor device. The method includes forming a patterned hardmask over an underlying target layer on a substrate; and performing plasma fabrication operations in parallel on the patterned hardmask and underlying target layer in a plasma etching chamber using a plasma etch gas and a selective source gas. The plasma operations include forming a protective cap on the patterned hardmask; and removing portions of the underlying layer that are not covered by the patterned hardmask. In various embodiments, the selective source gas includes a chemical compound that includes a halogen gas that can be dissociated into a metal and a halogen, and the plasma operations include dissociating the metal and the halogen in the selective source gas and forming a protective cap on the patterned hardmask using the metal that has been dissociated.

20 Claims, 13 Drawing Sheets

(51) Int. Cl.
*G03F 7/004* (2006.01)
*G03F 7/075* (2006.01)
*H10P 50/24* (2026.01)

(58) Field of Classification Search
CPC ...... H10P 50/283; H10P 50/692; H10P 50/71; H10P 50/73
USPC ...................................................... 430/5, 313
See application file for complete search history.

(56) References Cited

U.S. PATENT DOCUMENTS

| | | | | |
|---|---|---|---|---|
| 2004/0038541 | A1* | 2/2004 | Baier | H10P 70/273 438/723 |
| 2018/0175173 | A1* | 6/2018 | Chang | H10D 30/024 |
| 2021/0057213 | A1* | 2/2021 | Ito | H01J 37/32009 |
| 2021/0159082 | A1* | 5/2021 | Lutker-Lee | H10P 50/244 |
| 2022/0189786 | A1 | 6/2022 | Lin et al. | |

* cited by examiner

500

BOILING POINT (°C) AT 1 atm

| Chlorides | | Fluorides | |
|---|---|---|---|
| $AlCl_3$ | 177.8 | $AlF_3$ | 1291 |
| $SiCl_4$ | 57.6 | $SiF_4$-86 | |
| $Cu_2Cl_2$ | 1490 | $Cu_2F_2$ | 1100 |
| $TiCl_4$ | 136.4 | $TiF_4$ | 284 |
| $WCl_6$ | 346.7 | $WF_6$ | 17.5 |

502

| Chemistry | Primary Films Etched |
|---|---|
| Cl-based ($Cl_2$ , $BCl_3$) | Al alloys, Ti, TiN, resist |
| F-based ($SF_6$ , $CF_4$ , $CHF_3$) | W, TiW, $SiO_2$, resist |
| O-based ($O_2$ , $O_3$ , $CO_2$ , $H_2O$) | Resist |

FIG. 5A

SELECTIVE HARDMASK ON HARDMASK

CROSS-REFERENCE TO RELATED APPLICATION

This application claims the benefit of U.S. Provisional Application No. 63/384,676, filed Nov. 22, 2022.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum feature sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5A depicts a table that lists boiling points for various halogen gases from which a selective source gas may be selected, in accordance with some embodiments.

DETAILED DESCRIPTION

Figure 1A:
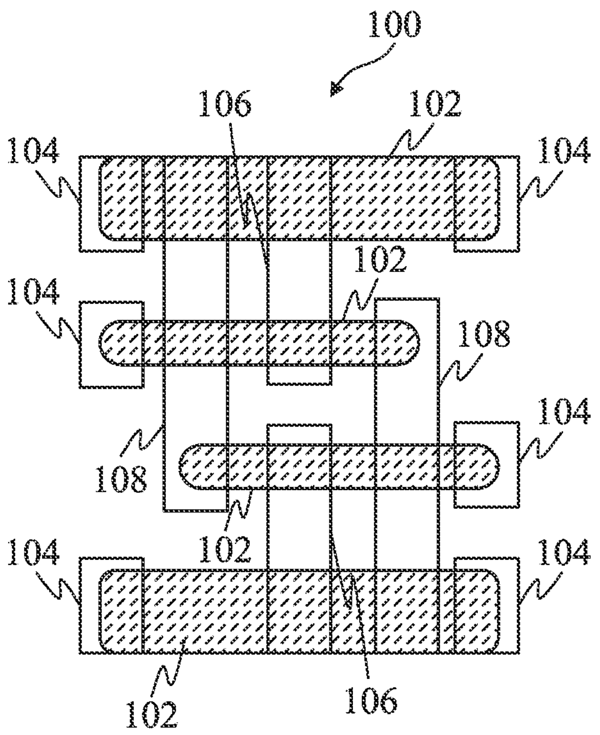
FIG. 1A is a block diagram depicting an example ideal line/space pattern to be transferred to a target layer, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting.

For the sake of brevity, conventional techniques related to conventional semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many conventional processes will only be mentioned briefly herein or will be omitted entirely without providing the well-known process details. As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

Furthermore, spatially relative terms, such as “over”, “overlying”, “above”, “upper”, “top”, “under”, “underlying”, “below”, “lower”, “bottom”, and the like, may be used herein for ease of description to describe one element’s or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When a spatially relative term, such as those listed above, is used to describe a first element with respect to a second element, the first element may be directly on the other element, or intervening elements or layers may be present. When an element or layer is referred to as being “on” another element or layer, it is directly on and in contact with the other element or layer.

In addition, the present disclosure may repeat reference numerals and/or letters in the various examples. This repetition is for the purpose of simplicity and clarity and does not in itself dictate a relationship between the various embodiments and/or configurations discussed.

It is noted that references in the specification to “one embodiment,” “an embodiment,” “an example embodiment,” “exemplary,” “example,” etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to affect such feature, structure, or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

Various devices or integrated circuits may be fabricated on a substrate using various fabrication techniques. The fabrication techniques may involve forming a target layer on a substrate, forming a mask over the target layer, patterning the mask, and transferring the mask pattern to the underlying target layer via etching operations. Plasma etching may be desired for transferring a hardmask pattern to an underlying target layer for patterning transfer, but when the transferred pattern includes a small island or short line structure in a line/space pattern, undesired etching of the hardmask during the plasma etching operations may result in rounded corners for the small island or short line structure. To reduce the occurrence of rounded corners for the small island or short line structure, disclosed embodiments provided herein describe a novel method of forming a hardmask cap on the patterned hardmask during plasma etching operations to achieve more precise patterning transfer for small island and short line structures.

FIG. 1A is a block diagram depicting an example ideal line/space pattern 100 to be transferred to a target layer. Depicted are lower layer structures 102 formed on a substrate (not shown) and patterned openings 104, 106, 108 in a mask layer for patterning a target layer (not shown) over the lower layer structures 102. The desired example patterned openings 104, 106, 108 include small island corner openings 104, short line openings 106, and long line openings 108.

Figure 1B:
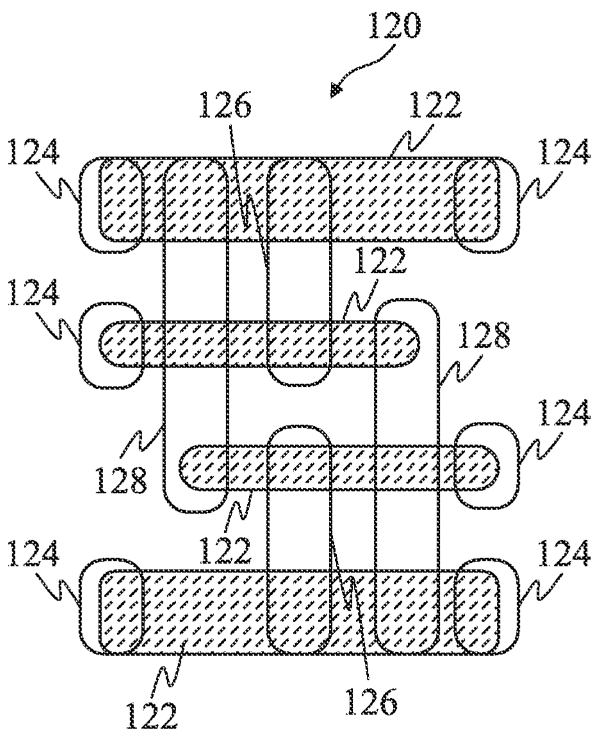
FIG. 1B is a block diagram depicting an example actual line/space pattern transferred to a target layer using plasma fabrication operations that include forming a hardmask cap on a patterned hardmask during plasma etching operations, in accordance with some embodiments.

FIG. 1B is a block diagram depicting an example line/space pattern 120 transferred to a target layer using plasma fabrication operations that include forming a hardmask cap on the patterned hardmask during plasma etching operations. Depicted are lower layer structures 122 formed on a substrate (not shown) and patterned structures 124, 126, 128 in a target layer over the lower layer structures 122. The example patterned structures 124, 126, 128 include small island patterned structures 124, short line patterned structures 126, and long line patterned structures 128. Because a hardmask cap was formed on the patterned hardmask during plasma etching operations, nearly ideal pattern transfer occurred between the hardmask and the target layer. In this example minimal corner rounding occurred.

Figure 2:
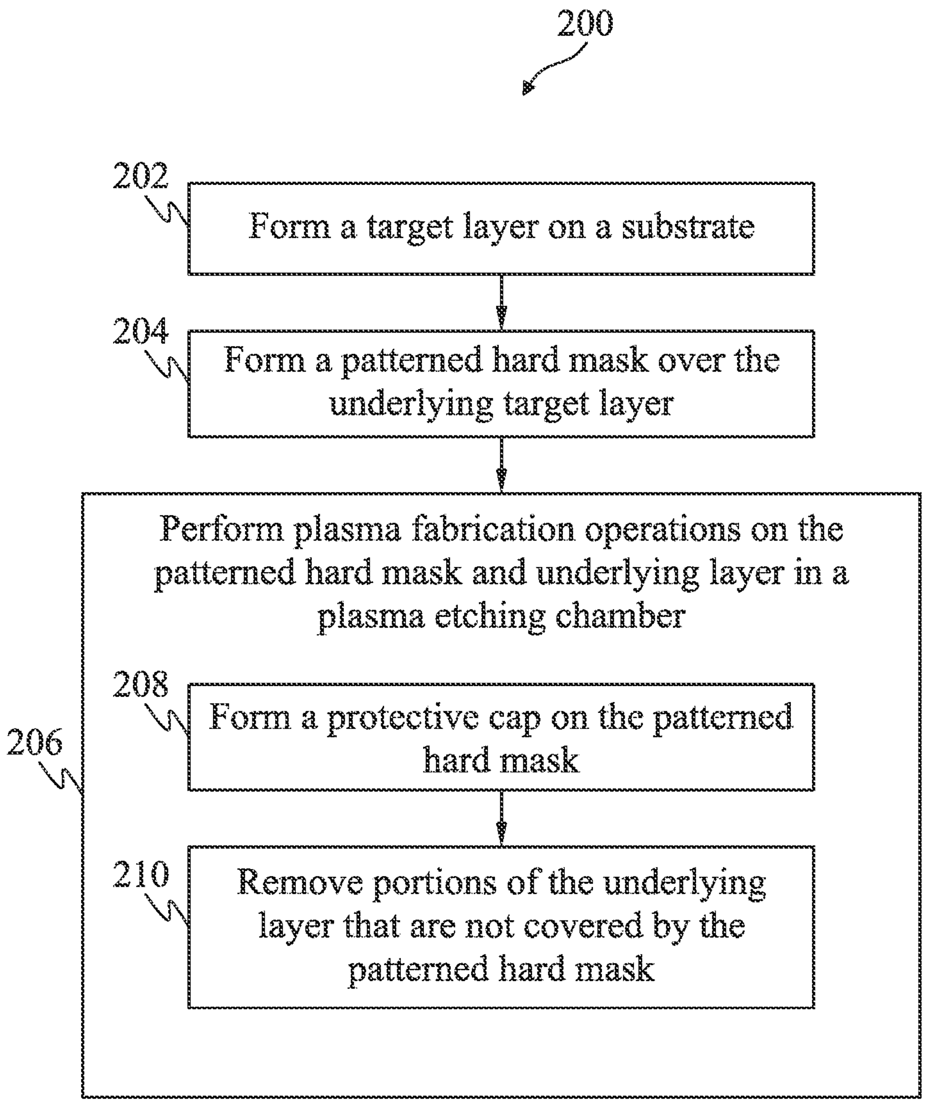
FIG. 2 is a process flow chart depicting an example method of semiconductor fabrication, in accordance with some embodiments.

FIG. 2 is a process flow chart depicting an example method 200 of semiconductor fabrication. FIG. 2 is described in conjunction with FIGS. 3A-3D, which illustrate a semiconductor structure 300 at various stages of fabrication in accordance with some embodiments. The method 200 is merely an example and is not intended to limit the present disclosure beyond what is explicitly recited in the claims. Additional steps may be provided before, during, and after method 200, and some of the steps described can be moved, replaced, or eliminated for additional embodiments of method 200. Additional features may be added in the semiconductor structure 300 depicted in the figures, and some of the features described below can be replaced, modified, or eliminated in other embodiments.

As with the other method embodiments and exemplary devices discussed herein, it is understood that parts of the semiconductor structures may be fabricated by typical semiconductor technology process flow, and thus some processes are only briefly described herein. Further, the exemplary semiconductor structures may include various other devices and features, such as other types of devices such as additional transistors, bipolar junction transistors, resistors, capacitors, inductors, dials, fuses, and/or other logic devices, etc., but is simplified for better understanding of concepts of the present disclosure.

At block 202, the example method 200 includes forming a target layer on a substrate. The target layer is a layer in a semiconductor structure that will be the target of a pattern transfer from a mask via etching operations. The target layer may be formed as a plurality of patterns. The plurality of patterns may vary, for example, may be a metal pattern, a semiconductor pattern, and an insulator pattern. For example, the plurality of patterns may be various patterns applied to a semiconductor integrated circuit device. The target layer may contain a material that is to be finally patterned. The material of the target layer may be, for example, a metal such as aluminum or copper, a semiconductor such as silicon, or an insulator such as silicon oxide or silicon nitride. The target layer may be formed by using various methods such as sputtering, electronic beam deposition, chemical vapor deposition, and physical vapor deposition. The target layer may be formed as, for example, a silicon layer, a polysilicon layer, an oxide layer, a silicon oxide layer, a silicon nitride layer, a silicon nitroxide layer, a silicon oxynitride (SiON) layer, a silicon carbide (SiC) layer, a derivative layer thereof, or other chemical compositions used during semiconductor fabrication.

Figure 3A:
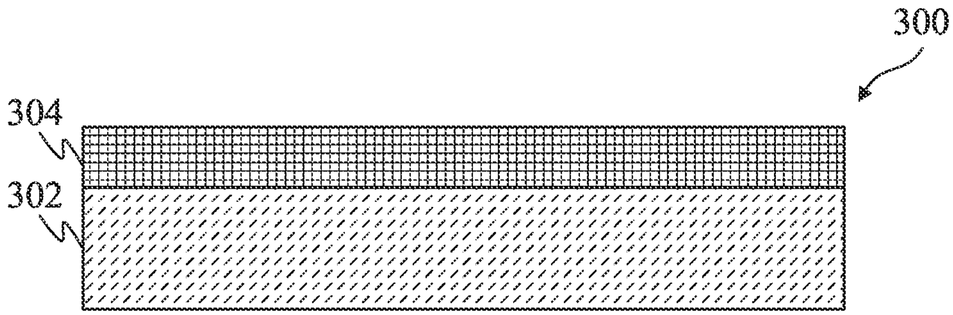
FIGS. 3A-3D are block diagrams that illustrate a semiconductor structure at various stages of fabrication, in accordance with some embodiments.
Figure 3B:
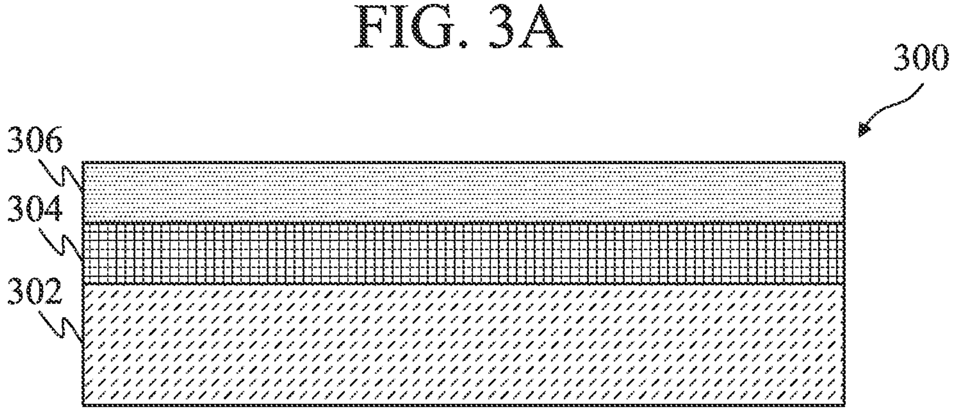
Figure 3C:
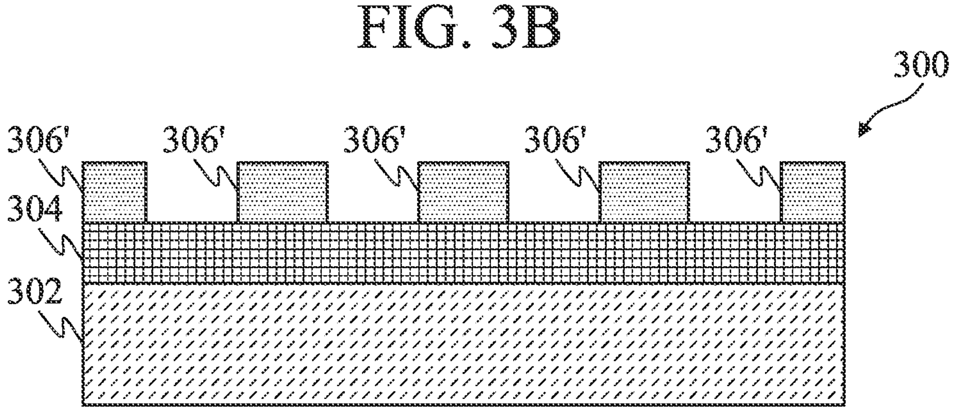

Referring to the example of FIG. 3A, in an embodiment of block 202, a substrate 302 is provided with a target layer 304 disposed thereon. In some embodiments, the substrate 302 may be a semiconductor substrate such as a silicon substrate. The substrate 302 may include various layers, including conductive or insulating layers formed on a semiconductor substrate. The substrate 302 may include various doping configurations depending on design requirements as is known in the art. For example, different doping profiles (e.g., n wells, p wells) may be formed on the substrate 302 in regions designed for different device types (e.g., n-type field effect transistors (NFET), p-type field effect transistors (PFET)). The suitable doping may include ion implantation of dopants and/or diffusion processes. The substrate 302 typically has isolation features (e.g., shallow trench isolation (STI) features) interposing the regions providing different device types. The substrate 302 may also include other semiconductors such as germanium, silicon carbide (SiC), silicon germanium (SiGe), or diamond. Alternatively, the substrate 302 may include a compound semiconductor and/or an alloy semiconductor. Further, the substrate 302 may optionally include an epitaxial layer (epi-layer), may be strained for performance enhancement, may include a silicon-on-insulator (SOI) structure, and/or have other suitable enhancement features.

At block 204, the example method 200 includes forming a patterned hardmask over the underlying target layer. In various embodiments forming a patterned hardmask includes forming a hardmask over the underlying target layer followed by patterning the hardmask. The hardmask is patterned to expose select portions of the underlying target layer to semiconductor processing, such as etching operations, while protecting covered portions of the underlying target layer from the semiconductor processing.

The hardmask may be formed from a chemical compound that includes a metal or silicon. In various embodiments, the hardmask is formed from a chemical compound comprising tungsten carbide (WC), silicon nitride (SiN), aluminum oxide (AlO), aluminum nitride (AlN), titanium oxide (TiO), or titanium nitride (TiN). The hardmask may be formed over the underlying target layer using known deposition methods. Referring to the example of FIG. 3B, in an embodiment of block 204, a hardmask 306 is formed over the target layer 304.

The hardmask may be patterned using known patterning methods. In various embodiments, a photoresist layer may be formed on the hardmask, a photoresist pattern may be formed by exposing and developing the photoresist layer by using a common method in the art, and the hardmask may be etched by using the photoresist pattern as an etching mask to form a hardmask pattern. Referring to the example of FIG. 3C, in an embodiment of block 204, a patterned hardmask 306' is formed over the target layer 304.

At block 206, the example method 200 includes performing plasma fabrication operations in parallel on the patterned hardmask and exposed portions of the underlying target layer in a plasma etching chamber using a plasma etch gas and a selective source gas. Although the hardmask is chosen for selectivity against etching via the plasma etch gas, some level of etching of the hardmask may occur that can change the original patterning dimensions of the hardmask. This can lead to non-ideal pattern transfer to the underlying target layer during plasma etching operations. Disclosed herein are the use of a selective source gas during the plasma fabrication operations for reducing the level of hardmask etching that can materially change the original patterning dimensions of the hardmask.

In various embodiments, when the patterned hardmask is formed from a chemical compound that includes a metal, the selective source gas includes a chemical compound that includes the metal in the chemical compound from which the hardmask is formed. In various embodiments, when the patterned hardmask is formed from a chemical compound that includes silicon, the selective source gas includes a chemical compound that includes Tungsten (W). In various embodiments, the selective source gas includes a chemical compound that includes a halogen gas that can be dissociated into the metal in the chemical compound from which the hardmask is formed and a halogen (e.g., Fluorine, Chlorine). In various embodiments, the selective source gas is selected based on the boiling point of the halogen gas.

The plasma fabrication operations include, at block 208, forming a protective cap on the patterned hardmask, while, at block 210, removing portions of the underlying layer that are not covered by the patterned hardmask. In various embodiments, the protective cap on the patterned hardmask is formed using dissociated metal from the selective gas source. In various embodiments, forming a protective cap on the patterned hardmask using the metal that has been dissociated includes combining the metal that has been dissociated with dissociated elements of the plasma etch gas to form the protective cap. In various embodiments, portions of the underlying layer that are not covered by the patterned hardmask are removed or etched via the plasma etch gas and/or the halogen that has been dissociated. In various embodiments, removing portions of the underlying layer that are not covered by the patterned comprises performing anisotropic etching operations using the plasma etch gas.

Figure 3D:
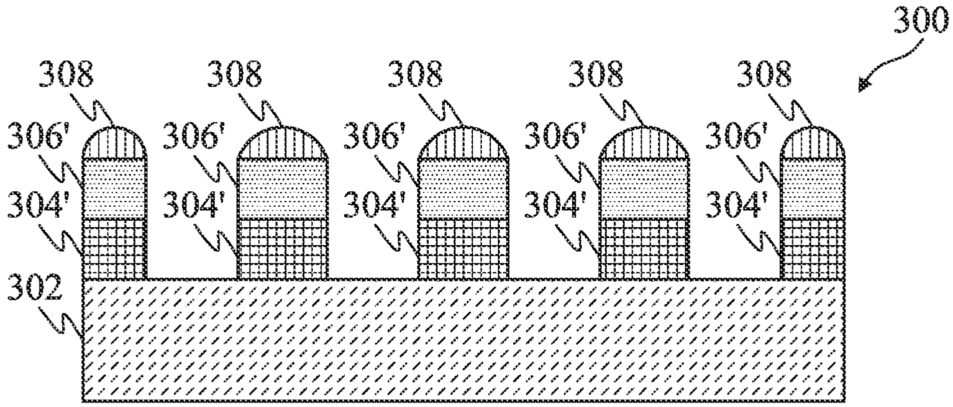

Referring to the example of FIG. 3D, in an embodiment of blocks 206, 208, 210, a patterned target layer 304' is disposed over the substrate 302. The patterned target layer 304' reflects the pattern transferred by the patterned hardmask 306' to the patterned target layer 304'. Formed over the patterned hardmask 306' is a protective cap 308 that protects the patterned hardmask 306' from etching loss during etching operations.

Figure 4:
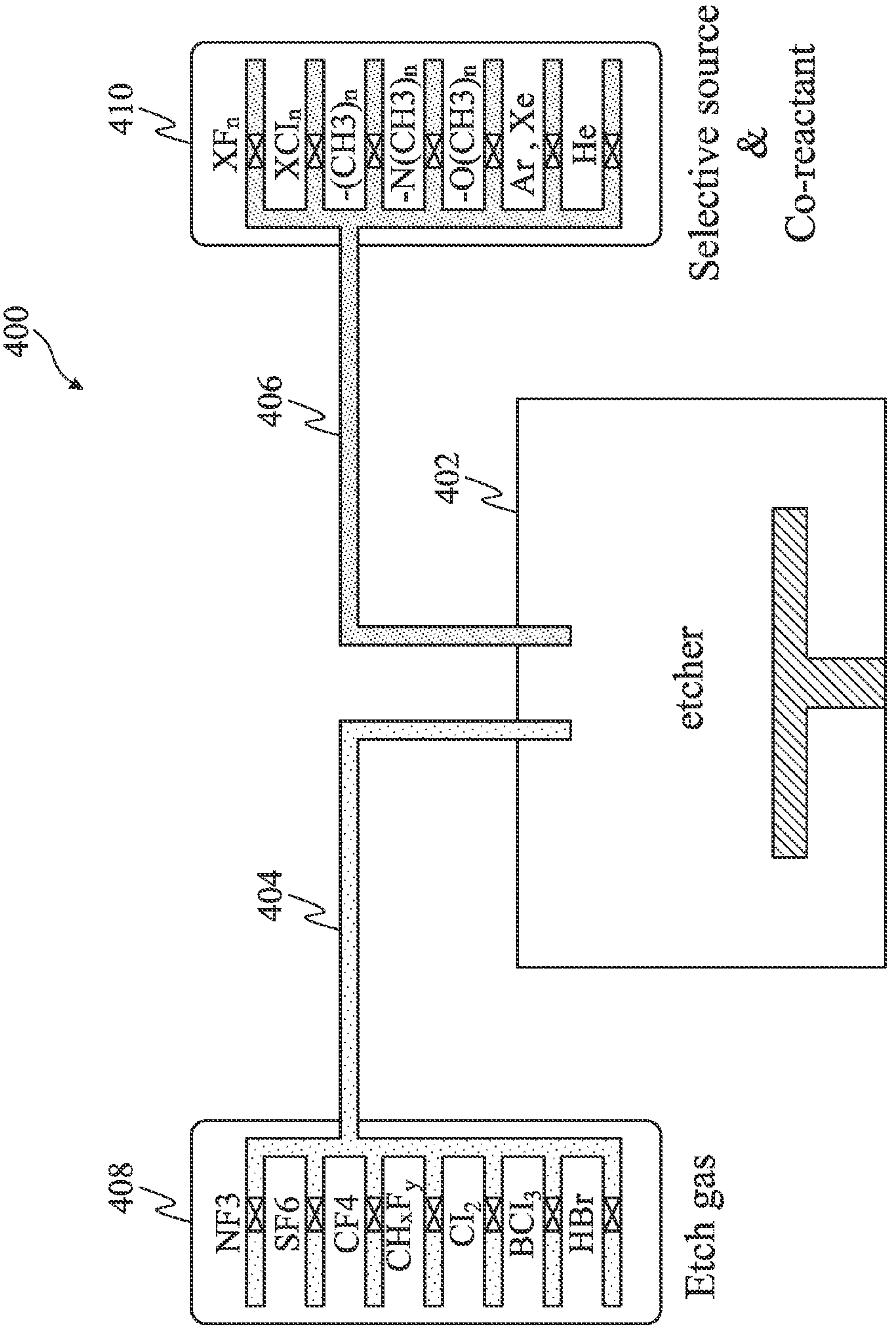
FIG. 4 is a block diagram of an example environment for plasma fabrication operations, in accordance with some embodiments.

FIG. 4 is a block diagram of an example environment 400 for plasma fabrication operations that includes a plasma etcher 402. The example plasma etcher 402 includes a plurality of gas input lines 404, 406 for inputting gases into a plasma etching chamber of the plasma etcher 402 for performing plasma fabrication operations on a semiconductor structure (not shown) situated within the plasma etching chamber. In this example, a first gas input line 404 is provided to supply plasma etch gas and a second gas input line 406 is provided to input a selective source gas and co-reactant for plasma fabrication operations. The first gas input line 404 has connections to multiple etching gas sources 408 and the second gas input line 406 has connections to multiple selective source and co-reactant gas sources 410. Through selection of the etch gas and the selective source gas, the example plasma etcher 402 can accomplish forming a protective cap on a patterned hardmask over an underlying target layer, while removing portions of an underlying target layer that are not protected by the patterned hardmask.

In various embodiments, the plasma etching chamber uses inductively coupled plasma (ICP), capacitively coupled plasma (CCP), or electron cyclotron resonance (ECR) plasma. In various embodiments, the plasma etch gas comprises Florine, Chlorine, or Bromine. In various embodiments, the selective source gas comprises a fluoride (e.g., $WF_6$), a chloride (e.g., $TiCl_4$, $AlCl_3$) or a precursor (e.g., $Al(CH_3)_2Cl$). In various embodiments, the process temperature is between 0 C to approximately 150 C. In various embodiments, the process pressure is between 1 mtorr to approximately 1 torr. In various embodiments, the source power is between 50 W to approximately 1200 W. In various embodiments, the source power frequency is 13.56 MHz and above. In various embodiments, the bias power is between 0 V to approximately 1200 V. In various embodiments, the bias power frequency is 13.56 MHz and below. In various embodiments, the duty cycle is between 1 and 100%.

FIG. 5A includes a table 500 that lists boiling points for various halogen gases—Chlorides and Fluorides—from which a selective source gas may be selected. In various embodiments, a hardmask may be formed from a chemical compound that includes tungsten carbide (WC), silicon nitride (SiN), aluminum oxide (AlO), aluminum nitride (AlN), titanium oxide (TiO), or titanium nitride (TiN). When the hardmask is formed from WC or SiN, selective source gas that includes tungsten (W) may be selected. When the hardmask is formed from AlO or AlN, a selective source gas that includes aluminum (Al) may be selected. When the hardmask is formed from TiO or TiN, a selective source gas that includes titanium (Ti) may be selected. As illustrated in FIG. 5A, because the boiling points of $WF_6$, $AlCl_3$, or $TiCl_4$ are low enough, $WF_6$ may be selected as a selective source gas for W-based or SiN-based hardmasks, $AlCl_3$ may be selected as a selective source gas for Al-based hardmasks, and $TiCl_4$ may be selected as a selective source gas for Ti-based hardmasks.

FIG. 5A also includes a table 502 that includes example chemistries for etch gases that may be used for etching various films. As illustrated, for Si etch, $SF_6$ may be used as an etch gas, and for an oxide etch $CH_xF_y$ gas may be used as an etch gas.

Figure 5B:
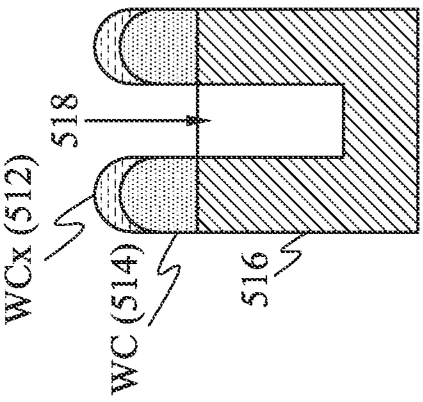
FIGS. 5B-5D are block diagrams illustrating example plasma fabrication operations that can be performed based on hardmask chemical composition, etch gas used, and selective source gas used, in accordance with some embodiments.
Figure 5C:
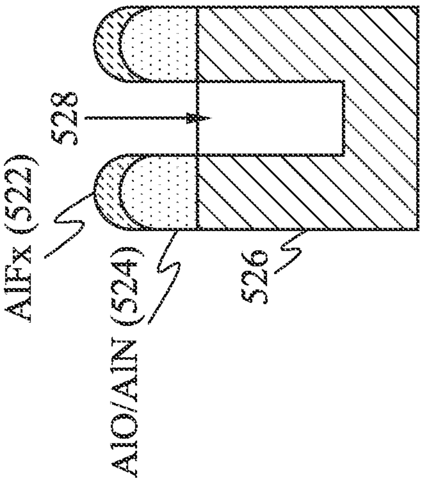
Figure 5D:
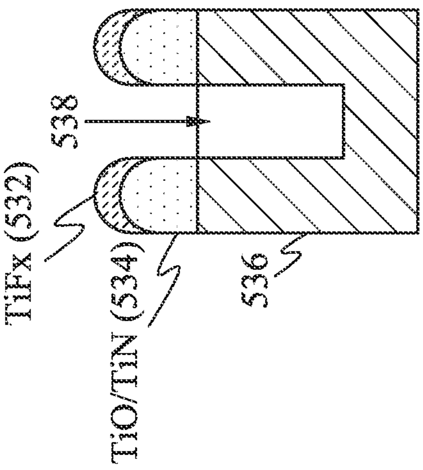

FIGS. 5B, 5C, and 5D are block diagrams illustrating example plasma fabrication operations that can be performed based on hardmask chemical composition, etch gas used, and selective source gas used. The example of FIG. 5B illustrates that, during plasma fabrication operations using a plasma gas and a selective source gas, a protective cap layer 512 formed from $WC_x$ can be formed over a patterned hardmask 514 formed from WC which is, in turn, formed over an oxide 516. In parallel, an opening 518 can be etched in non-protected portions of the oxide 516. The protective cap layer 512 protects the critical dimension (CD) of the hardmask 514 from reduction by the etching gas, while dissociated W from the selective source gas combines with dissociated C from the etching gas to form the $WC_x$ protective cap layer 512 over the WC hardmask 514. In this example, the selective source gas includes $WF_6$, for providing W for forming the protective cap layer 512 and the etching gas includes $CH_xF_y$ gas for oxide etch.

The example of FIG. 5C illustrates that, during plasma fabrication operations using a plasma gas and a selective source gas, a protective cap layer 522 formed from $AlF_x$ can be formed over a patterned hardmask 524 formed from AlO or MN which is, in turn, formed over Si 526. In parallel, an opening 528 can be etched in non-protected portions of the Si 526. The protective cap layer 522 protects the CD of the hardmask 524 from reduction by the etching gas, while dissociated Al from the selective source gas combines with dissociated F from the etching gas to form the $AlF_x$ protective cap layer 522 over the AlO/AlN hardmask 524. In this example, the selective source gas includes $AlCl_3$, for providing Al for forming the protective cap layer 522 and the etching gas includes $SF_6$ gas for Si etch.

The example of FIG. 5D illustrates that, during plasma fabrication operations using a plasma gas and the selective source gas, a protective cap layer 532 formed from $TiF_x$ can be formed over a patterned hardmask 534 formed from TiO or TiN which is, in turn, formed over Si 536. In parallel, an opening 538 can be etched in non-protected portions of the Si 536. The protective cap layer 532 protects the CD of the hardmask 534 from reduction by the etching gas, while dissociated Ti from the selective source gas combines with dissociated F from the etching gas to form the $TiF_x$ protective cap layer 532 over the TiO/TiN hardmask 534. In this example, the selective source gas includes $TiCl_4$, for providing Ti for forming the protective cap layer 532 and the etching gas includes $SF_6$ gas for Si etch.

Figure 6:
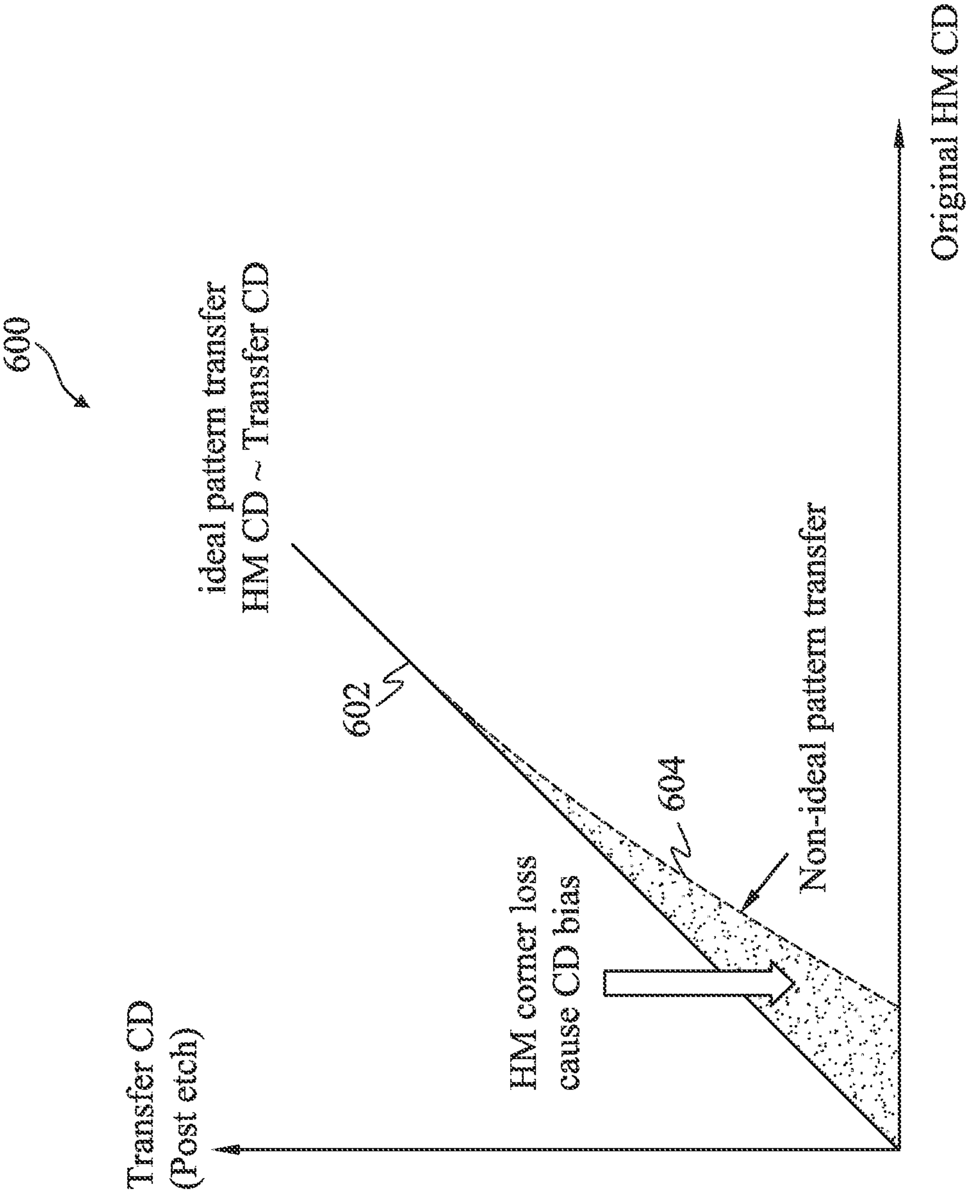
FIG. 6 is an example line graph diagram illustrating a line graph of an ideal pattern transfer of a hardmask critical dimension to a target layer transfer critical dimension, in accordance with some embodiments.

FIG. 6 is an example line graph diagram 600 illustrating a line graph 602 of an ideal pattern transfer of a hardmask (HM) critical dimension (CD) to a target layer transfer (CD), wherein the HM CD is approximately equal to the transfer CD. The example line graph diagram 600 also depicts a line graph 604 of a non-ideal pattern transfer of a HM CD to a target layer transfer CD, wherein corner loss in the HM CD can cause a CD bias in the transfer CD.

Figure 7A:
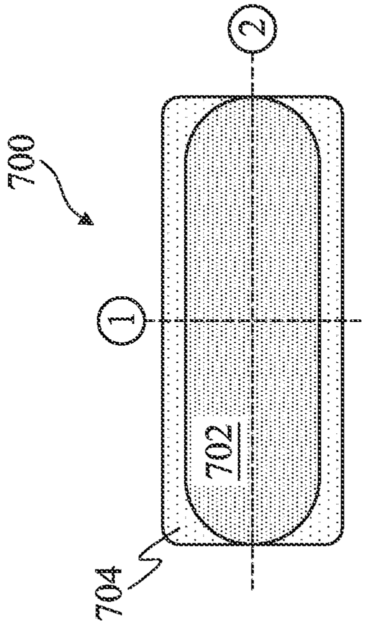
FIGS. 7A-7C are block diagrams depicting various views of an example semiconductor structure after plasma etching operations without a protective cap, in accordance with some embodiments.
Figure 7B:
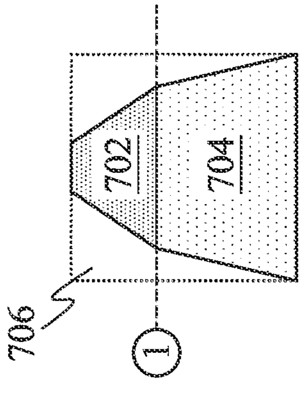
Figure 7C:
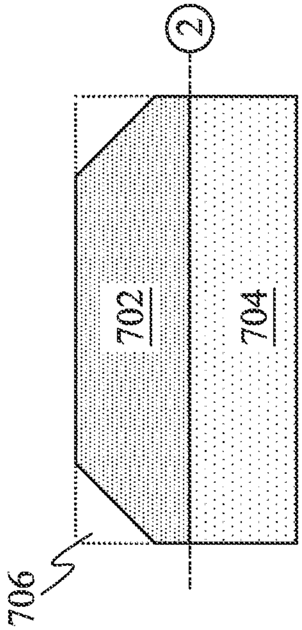

FIG. 7A is a block diagram depicting a top view of an example semiconductor structure 700 after plasma etching operations without a protective cap. The example semiconductor structure 700 includes a hardmask 702 (that has been etched during plasma etching operations) formed over an underlying layer 704. FIG. 7A also illustrates two vertical cutlines—cutline 1 and cutline 2—that are perpendicular to each other. FIG. 7B is a block diagram depicting a side view of the example semiconductor structure 700 along the first cutline along with an outline of an ideal profile 706. FIG. 7C is a block diagram depicting example semiconductor structure 700 along the second cutline along with an outline of the ideal profile 706. These figures illustrate that when the CD is smaller, as in FIG. 7B, the hardmask 702 experiences more etching loss during plasma etching operations in that dimension than when the CD is larger, as in FIG. 7C. In the example of FIG. 7B, because the hardmask 702 experiences significant etching loss during plasma etching operations in that dimension, the underlying layer 704 does not achieve an ideal CD as indicated by the ideal profile 706. In the example of FIG. 7C, because the hardmask 702 does not experience significant etching loss during plasma etching operations in that dimension, the underlying layer 704 achieves an ideal CD as indicated by the ideal profile 706.

Figure 7D:
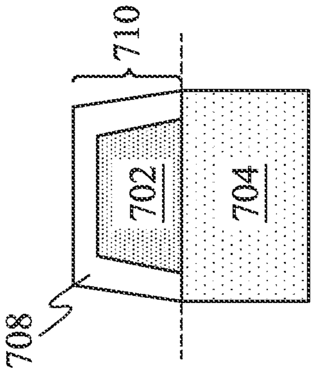
FIG. 7D is a block diagram depicting a side view of an example semiconductor structure after plasma etching operations with a protective cap, in accordance with some embodiments.

FIG. 7D is a block diagram depicting a side view of the example semiconductor structure 700 along the first cutline. In the example, of FIG. 7D, a protective cap 708 has been formed over the hardmask 702 to form a combined hardmask 710. The combined hardmask 710 maintains the CD of the original hardmask allowing an ideal CD to be transferred to the target layer 704.

Figure 8B:
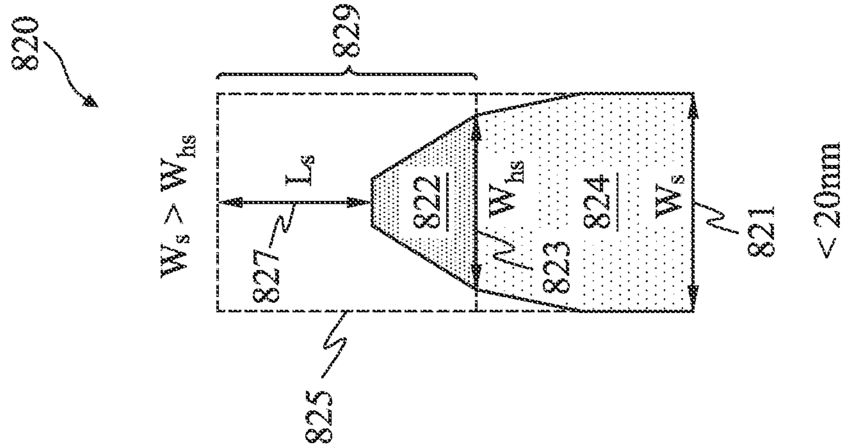
FIGS. 8A and 8B are block diagrams depicting example side views of example semiconductor structures, in accordance with some embodiments.
Figure 8A:
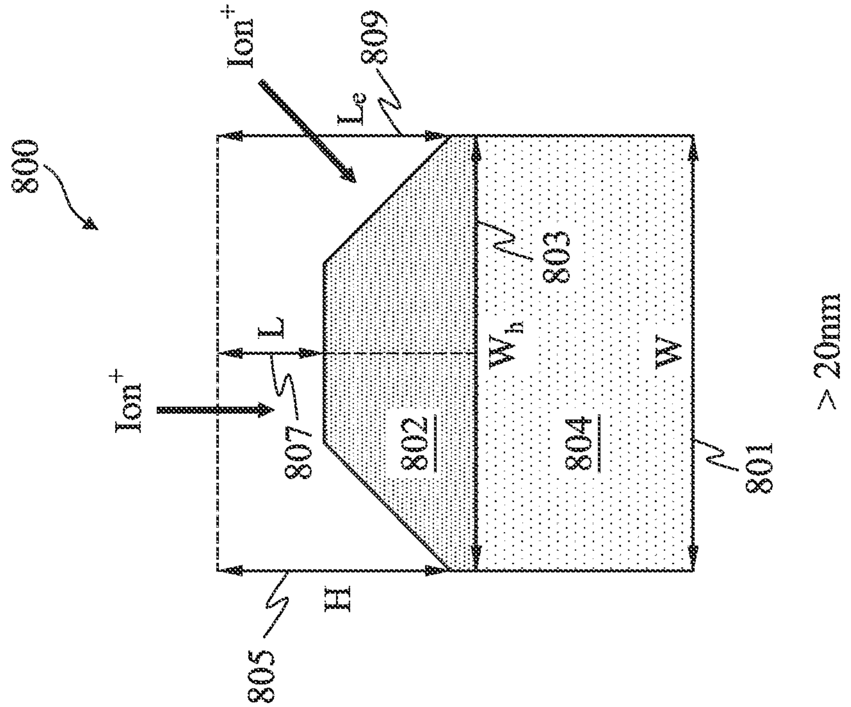

FIGS. 8A and 8B are block diagrams depicting example side views of example semiconductor structures 800, 820. These figures illustrate example dimensional relationships that can be achieved by forming a combined hardmask 802, 822 that includes a protective cap over an original hardmask for use in plasma etching operations to pattern a target layer 804, 824 in a plasma etching chamber.

In the example of FIG. 8A, the example semiconductor structure 800 has a width dimension (W) 801 at the bottom of the target layer 804 and a width dimension ($W_h$) 803 at the border between the combined hardmask 802 and the target layer 804. In this example, the width dimension (W) 801 is greater than 20 nm and the width dimension W is approximately equal to the width dimension $W_h$. The example semiconductor structure 800 further includes an original height dimension (H) 805 that is the height of the original hardmask before etching operations, a height loss dimension (L) 807 at a center portion of the combined hardmask 802, and a height loss dimension ($L_e$) 809 at an edge of the combined hardmask 802. The height loss dimension ($L_e$) 809 at an edge of the combined hardmask 802 is greater than (>) the height loss dimension (L) 807 at a center portion of the combined hardmask 802.

In the example of FIG. 8B, the example semiconductor structure 820 has a width dimension (W) 821 at the bottom of the target layer 824 and a width dimension ($W_{hs}$) 823 at the border between the combined hardmask 822 and the target layer 824. In this example, the width dimension ($W_s$) 821 is less than 20 nm and the width dimension $W_s$ is greater than (>) the width dimension $W_{hs}$. The example semiconductor structure 800 further includes an original height dimension (H) 825 that is the height of the original hardmask before etching operations, a height loss dimension ($L_s$) 827 at a center portion of the combined hardmask 822, and a height loss dimension ($L_{es}$) 829 at an edge of the combined hardmask 822. The height loss dimension ($L_{es}$) 829 at an edge of the combined hardmask 822 is greater than (>) the height loss dimension ($L_s$) 807 at a center portion of the combined hardmask 822. Also, there is more hardmask loss ($L_s$>L) in the short line ($W_s$). Higher loss in the edge can induce a CD bias issue ($W_s$>$W_{hs}$). There is no CD bias issue in the long line (W~$W_h$).

In various embodiments, the combined hardmask 802/822 has a height that is between 5 nm to approximately 100 nm. In various embodiments, the combined hardmask 802/822 has a width that is between 5 nm to approximately a two μm.

In various embodiments, a pattern variation between the combined hardmask 802/822 and the target layer 824 is less than or equal to three percent (3%), wherein the pattern variation is measured as the difference between a width ($W_h/W_{hs}$) at a border between the combined hardmask 802/822 and the target layer 804/824 and a width ($W/W_s$) at a bottom of the target layer 804/822. The pattern variation for the combined hardmask 802 having a width greater than 20 nm is less than the pattern variation for the combined hardmask 822 having a width less than 20 nm.

Figure 9A:
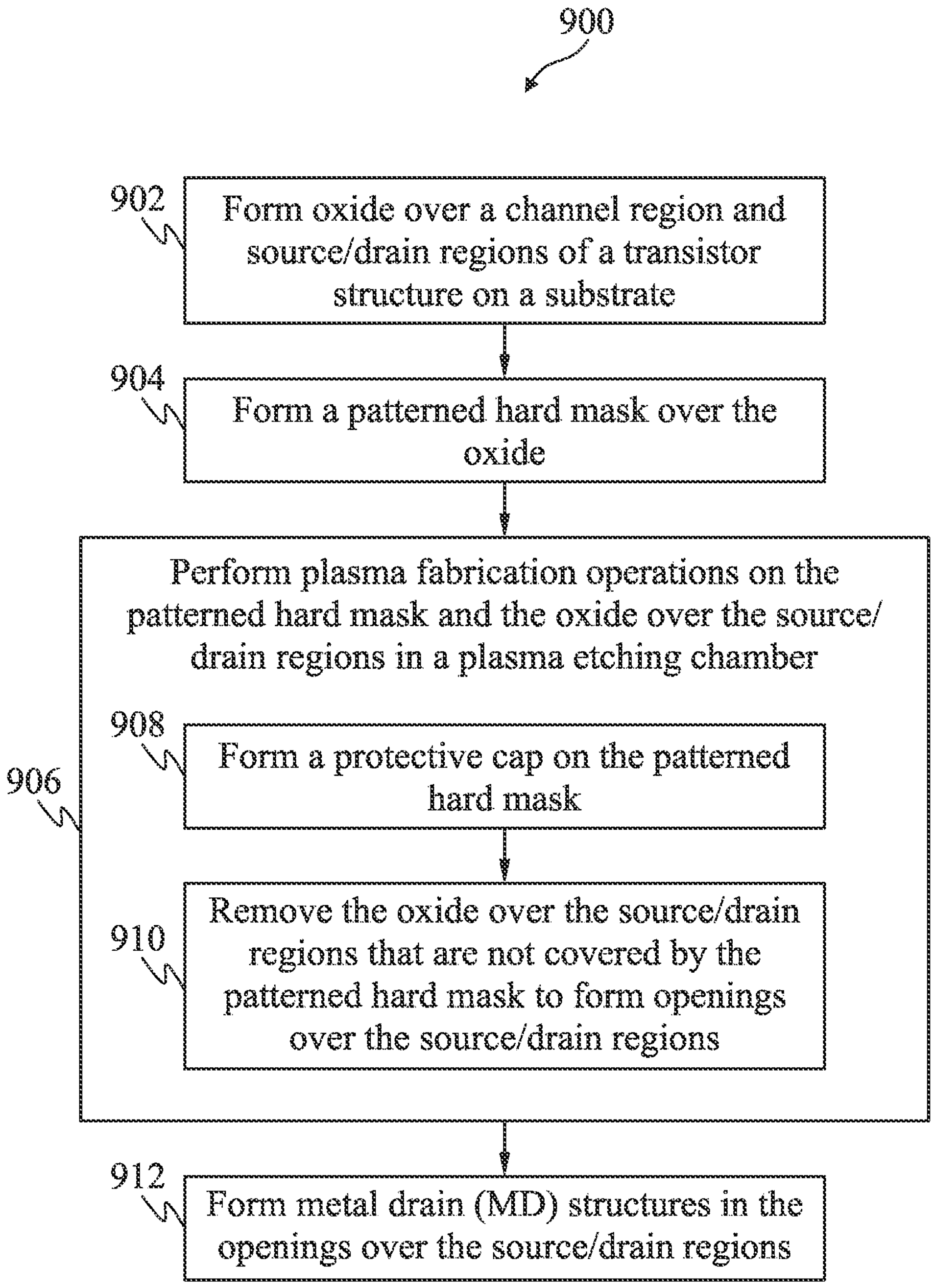
FIGS. 9A-9D are example process flow charts depicting example embodiments of methods described herein, in accordance with some embodiments.

FIGS. 9A-9D are example process flow charts depicting example embodiments of methods described herein. FIG. 9A is a is a process flow chart depicting an example method 900 of semiconductor fabrication that includes forming a metal drain structure. The method 900 is merely an example and is not intended to limit the present disclosure beyond what is explicitly recited in the claims. Additional steps may be provided before, during, and after method 900, and some of the steps described can be moved, replaced, or eliminated for additional embodiments of method 900.

At block 902, the example method 900 includes forming an oxide over a channel region and source/drain regions of a transistor structure on a substrate. Source/drain region(s) may refer to a source or a drain, individually or collectively dependent upon the context. At block 904, the example method 900 includes forming a patterned hardmask over the oxide that exposes oxide over the source/drain regions for processing. At block 906, the example method 900 includes performing plasma fabrication operations in parallel on the patterned hardmask and the oxide over the source/drain regions in a plasma etching chamber using a plasma etch gas and a selective source gas. The performing plasma fabrication operations on the patterned hardmask and the oxide over the source/drain regions includes, at block 908, forming a protective cap on the patterned hardmask and, at block 910, removing the oxide over the source/drain regions that are not covered by the patterned hardmask to form an opening over the source/drain regions. At block 912, the example method 900 includes forming metal drain (MD) structures in the openings over the source/drain regions.

Figure 9B:
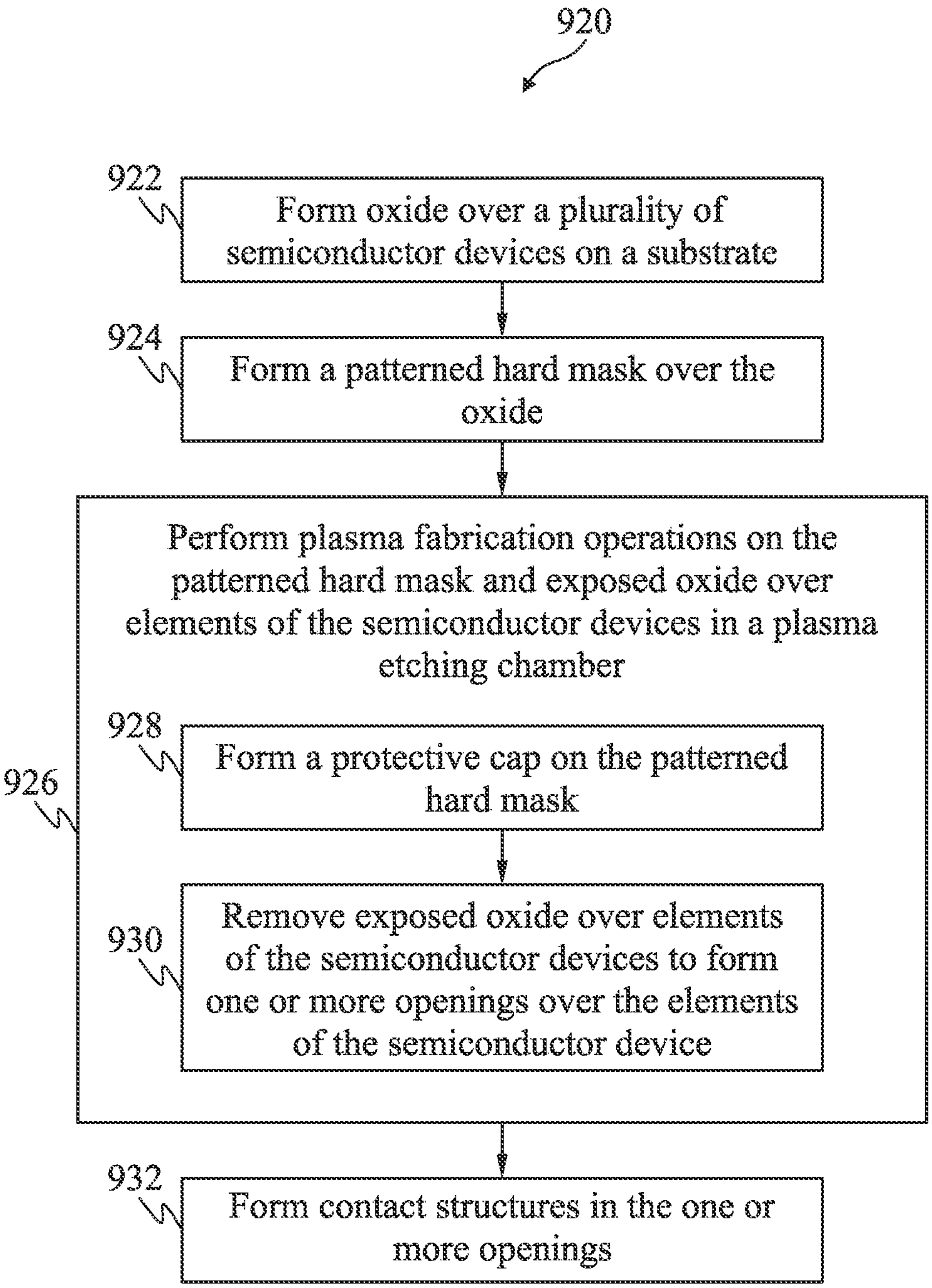

FIG. 9B is a is a process flow chart depicting an example method 920 of semiconductor fabrication that includes forming a contact structure. The method 920 is merely an example and is not intended to limit the present disclosure beyond what is explicitly recited in the claims. Additional steps may be provided before, during, and after method 920, and some of the steps described can be moved, replaced, or eliminated for additional embodiments of method 920.

At block 922, the example method 920 includes forming oxide over a plurality of semiconductor devices on a substrate. At block 924, the example method 920 includes forming a patterned hardmask over the oxide that exposes certain elements of the semiconductor devices for processing. At block 926, the example method 920 includes performing plasma fabrication operations in parallel on the patterned hardmask and the oxide over the certain elements of the semiconductor devices in a plasma etching chamber using a plasma etch gas and a selective source gas. The performing plasma fabrication operations on the patterned hardmask and the oxide over the certain elements of the semiconductor devices includes, at block 928, forming a protective cap on the patterned hardmask and, at block 930, removing exposed oxide over the certain elements of the semiconductor devices that are not covered by the patterned hardmask to form one or more openings over the certain elements of the semiconductor devices. At block 932, the example method 920 includes forming contact structures in the one or more openings over the elements of the semiconductor devices.

Figure 9C:
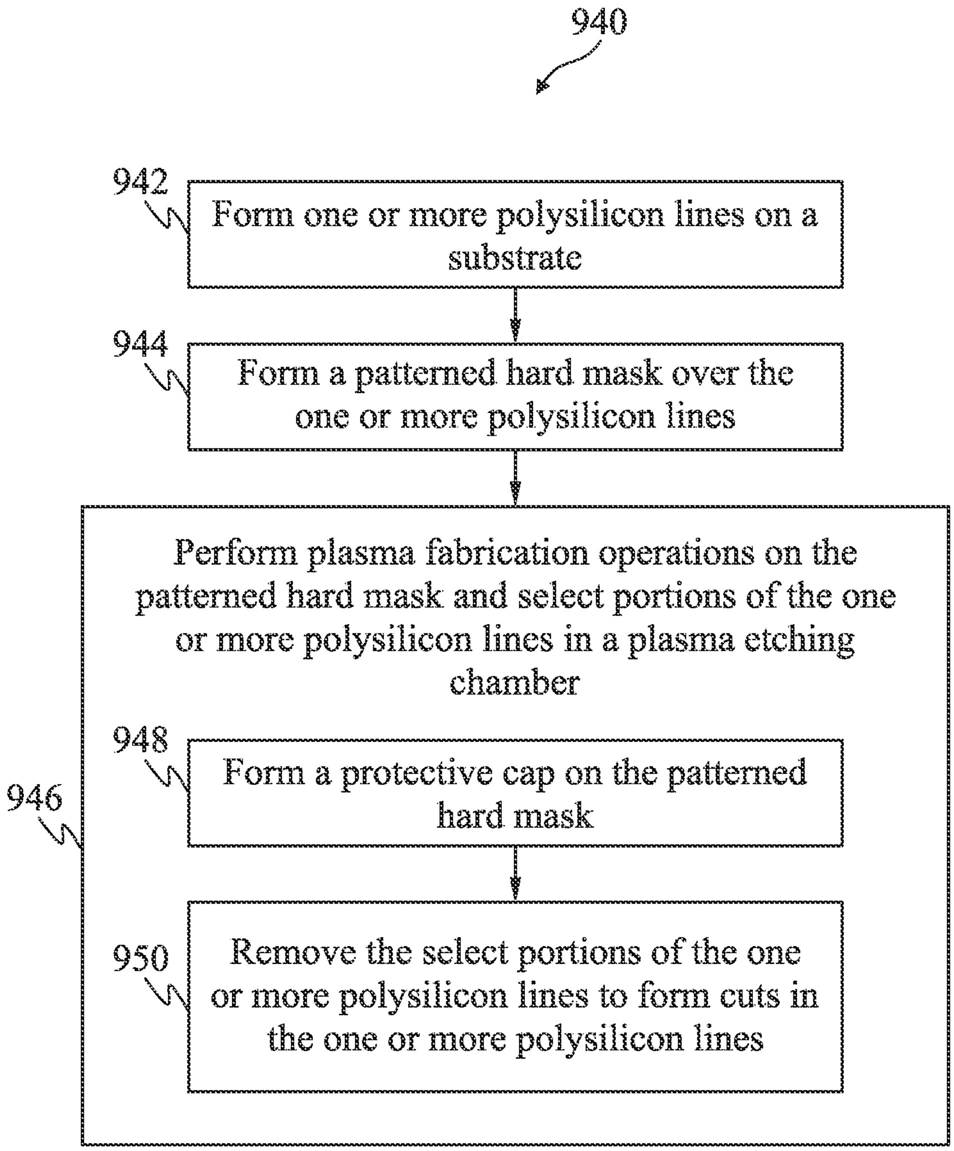

FIG. 9C is a process flow chart depicting an example method 940 of semiconductor fabrication that includes cut poly operations. The method 940 is merely an example and is not intended to limit the present disclosure beyond what is explicitly recited in the claims. Additional steps may be provided before, during, and after method 940, and some of the steps described can be moved, replaced, or eliminated for additional embodiments of method 940.

At block 942, the example method 940 includes forming one or more polysilicon lines on a substrate. At block 944, the example method 940 includes forming a patterned hardmask over the one or more polysilicon lines that exposes select portions of the one or more polysilicon lines for processing. At block 946, the example method 940 includes performing plasma fabrication operations in parallel on the patterned hardmask and the select portions of the one or more polysilicon lines in a plasma etching chamber using a plasma etch gas and a selective source gas. The performing plasma fabrication operations on the patterned hardmask and the select portions of the one or more polysilicon lines includes, at block 948, forming a protective cap on the patterned hardmask and, at block 950, removing the select portions of the one or more polysilicon lines that are not covered by the patterned hardmask to form one or more cuts in the one or more polysilicon lines.

Figure 9D:
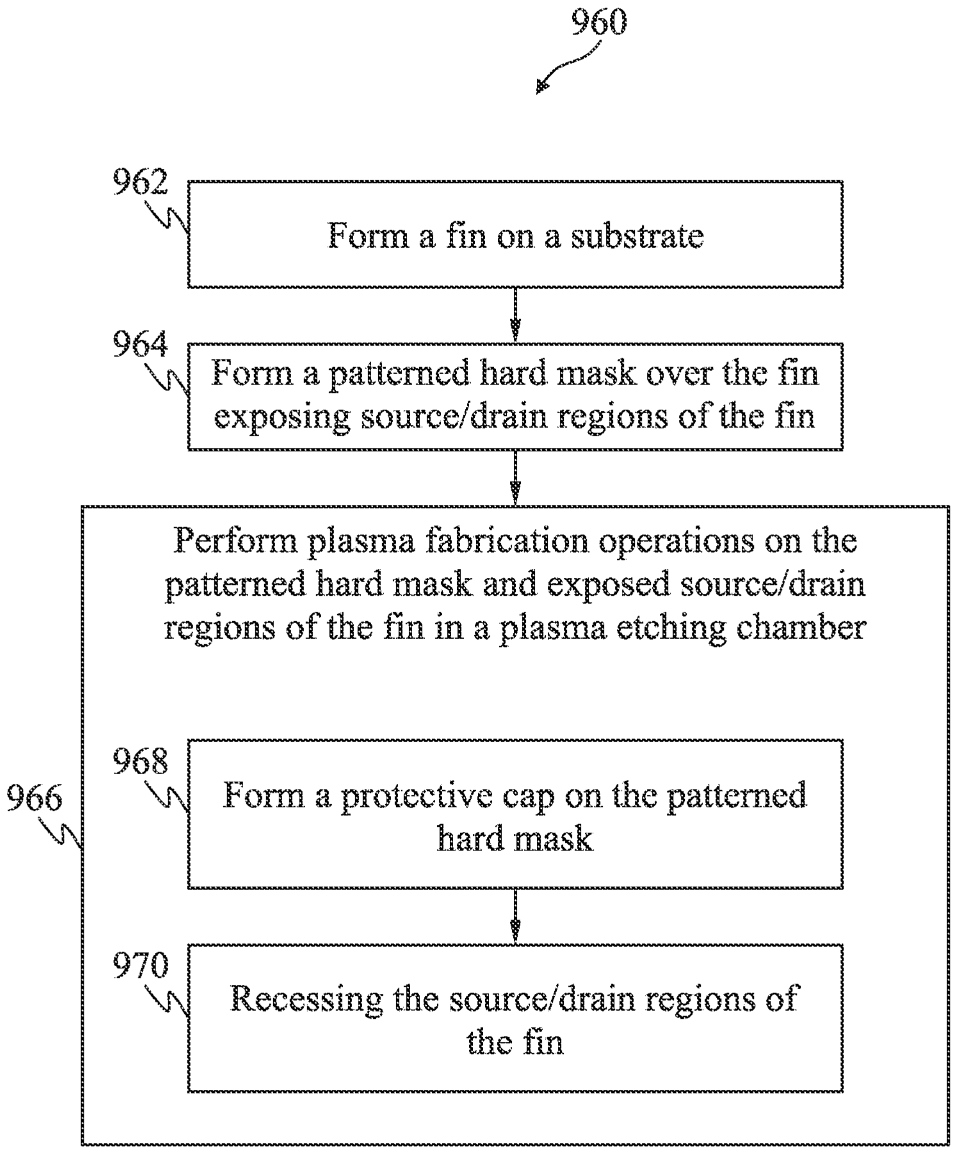

FIG. 9D is a process flow chart depicting an example method 960 of semiconductor fabrication that includes forming a fin for a FinFET device. The method 960 is merely an example and is not intended to limit the present disclosure beyond what is explicitly recited in the claims. Additional steps may be provided before, during, and after method 960, and some of the steps described can be moved, replaced, or eliminated for additional embodiments of method 960.

At block 962, the example method 960 includes forming a fin on a substrate, wherein the fin comprises a channel region and source/drain regions, and wherein the patterned hardmask exposes the source/drain regions of the fin for processing while covering the channel region. At block 964, the example method 960 includes forming a patterned hardmask over the fin that exposes source/drain regions of the fin for processing. At block 966, the example method 960 includes performing plasma fabrication operations in parallel on the patterned hardmask and exposed source/drain regions of the fin in a plasma etching chamber using a plasma etch gas and a selective source gas. The performing plasma fabrication operations on the patterned hardmask and the exposed source/drain regions of the fin includes, at block 968, forming a protective cap on the patterned hardmask and, at block 970, recessing the exposed source/drain regions of the fin.

According to example embodiments, a pattern formed by using a hardmask may be used in the manufacture and design of an integrated circuit device according to a preparation process of a semiconductor device. For example, the pattern may be used in the formation of a patterned material layer structure such as metal lining, holes for contact or bias, insulation sections (example: a Damascene Trench (DT) or shallow trench isolation (STI)), or a trench for a capacitor structure.

A method of manufacturing a semiconductor device is disclosed. The method includes forming a patterned hardmask over an underlying target layer on a substrate; and performing plasma fabrication operations in parallel on the patterned hardmask and underlying target layer in a plasma etching chamber using a plasma etch gas and a selective source gas. The plasma operations include forming a protective cap on the patterned hardmask; and removing portions of the underlying layer that are not covered by the patterned hardmask.

In various embodiments of the method, the selective source gas includes a chemical compound that includes the metal in the chemical compound from which the hardmask is formed.

In various embodiments of the method, the selective source gas includes a chemical compound that includes a halogen gas that can be dissociated into the metal in the chemical compound from which the hardmask is formed and a halogen (e.g., Fluorine, Chlorine).

Another method of manufacturing a semiconductor device is disclosed. The method includes forming a patterned hardmask over an underlying target layer on a substrate; and performing plasma fabrication operations in parallel on the patterned hardmask and underlying target layer in a plasma etching chamber using a plasma etch gas and a selective source gas. The selective source gas includes a chemical compound that includes a halogen gas that can be dissociated into a metal and a halogen (e.g., Fluorine, Chlorine). The plasma operations include dissociating the metal and the halogen in the selective source gas; forming a protective cap on the patterned hardmask using the metal that has been dissociated; and removing portions of the underlying layer that are not covered by the patterned hardmask using the plasma etch gas and the halogen that has been dissociated.

In various embodiments of the method, forming a protective cap on the patterned hardmask using the metal that has been dissociated includes combining the metal that has been dissociated with dissociated elements of the plasma etch gas to form the protective cap.

In various embodiments of the method, the underlying layer includes an oxide, the patterned hardmask includes tungsten carbide (WC) or silicon nitride (SiN), the plasma etch gas includes a fluoromethane ($CH_xF_y$) gas, the selective source gas includes tungsten hexafluoride ($WF_6$), and the dissociated tungsten (W) from the selective source gas combines with dissociated carbon (C) from the plasma etch gas to form the protective cap made from tungsten carbide ($WC_x$).

In various embodiments of the method, the underlying layer includes silicon (Si), the patterned hardmask includes aluminum oxide (AlO) or Aluminum nitride (AlN), the plasma etch gas includes Sulfur hexafluoride ($SF_6$) gas, the selective source gas includes aluminum chloride ($AlCl_3$), and dissociated Aluminum (Al) from the selective source gas combines with dissociated fluorine (F) from the plasma etch gas to form the protective cap including aluminum fluoride ($AlF_x$).

In various embodiments of the method, the underlying layer includes silicon (Si), the patterned hardmask includes titanium oxide (TiO) or titanium nitride (TiN), the plasma etch gas includes sulfur hexafluoride ($SF_6$) gas, the selective source gas includes titanium chloride ($TiCl_4$), and the dissociated Titanium (Ti) from the selective source gas combines with dissociated Fluorine (F) from the plasma etch gas to form the protective cap including Titanium fluoride ($TiF_x$)

Another method of manufacturing a semiconductor device is disclosed. The method includes forming a patterned hardmask over an underlying target layer on a substrate; and performing plasma fabrication operations in parallel on the patterned hardmask and underlying target layer in a plasma etching chamber using a plasma etch gas and a selective source gas. The plasma operations include reducing an amount of patterned hardmask etching during the plasma fabrication operations by forming a protective cap on the patterned hardmask; forming a combined hardmask including the patterned hardmask and the protective cap; and removing portions of the underlying layer that are not covered by the patterned hardmask.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method of manufacturing a semiconductor device, the method comprising:
- forming a patterned hardmask over an underlying target layer on a substrate; and
- performing plasma fabrication operations in parallel on the patterned hardmask and underlying target layer in a plasma etching chamber using a plasma etch gas and a selective source gas, the plasma fabrication operations including:
  - forming a protective cap on the patterned hardmask using a metal from the selective gas while removing portions of the underlying target layer that are not covered by the patterned hardmask.

2. The method of claim 1, wherein the patterned hardmask is formed from a chemical compound that includes the metal or silicon.

3. The method of claim 2, wherein the patterned hardmask is formed from a chemical compound comprising tungsten carbide (WC), silicon nitride (SiN), aluminum oxide (AlO), aluminum nitride (AlN), titanium oxide (TiO), or titanium nitride (TiN).

4. The method of claim 2, wherein the selective source gas comprises a chemical compound that includes Tungsten (W) when the patterned hardmask comprises Silicon.

5. The method of claim 2, wherein the selective source gas comprises a chemical compound that includes the metal in the chemical compound from which the patterned hardmask is formed.

6. The method of claim 5, wherein the selective source gas comprises a chemical compound comprising a halogen gas that can be dissociated into the metal in the chemical compound from which the patterned hardmask is formed and a halogen.

7. The method of claim 6, wherein the selective source gas is selected based on the boiling point of the halogen gas.

8. A method of manufacturing a semiconductor device, the method comprising:
- forming a patterned hardmask over an underlying target layer on a substrate; and
- performing plasma fabrication operations in parallel on the patterned hardmask and underlying target layer in a plasma etching chamber using a plasma etch gas and a selective source gas, wherein the selective source gas comprises a chemical compound comprising a halogen gas that can be dissociated into a metal and a halogen, the plasma fabrication operations comprising:

dissociating the metal and the halogen in the selective source gas;

forming a protective cap on the patterned hardmask using the metal that has been dissociated; and removing portions of the underlying target layer that are not covered by the patterned hardmask using the plasma etch gas and the halogen that has been dissociated.

9. The method of claim 8, wherein forming a protective cap on the patterned hardmask using the metal that has been dissociated comprises:

combining the metal that has been dissociated with dissociated elements of the plasma etch gas to form the protective cap.

10. The method of claim 8, wherein the underlying target layer comprises an oxide, the patterned hardmask comprises tungsten carbide (WC) or silicon nitride (SiN), the plasma etch gas comprises a fluoromethane ($CH_xF_y$) gas, and the selective source gas comprises tungsten hexafluoride ($WF_6$).

11. The method of claim 10, wherein dissociated tungsten (W) from the selective source gas combines with dissociated carbon (C) from the plasma etch gas to form the protective cap comprising tungsten carbide ($WC_X$).

12. The method of claim 8, wherein the underlying target layer comprises silicon (Si), the patterned hardmask comprises Aluminum oxide (AlO) or Aluminum nitride (AlN), the plasma etch gas comprises Sulfur hexafluoride ($SF_6$) gas, and the selective source gas comprises aluminum chloride ($AlCl_3$).

13. The method of claim 12, wherein dissociated Aluminum (Al) from the selective source gas combines with dissociated Fluorine (F) from the plasma etch gas to form the protective cap comprising Aluminum fluoride ($AlF_x$).

14. The method of claim 8, wherein the underlying target layer comprises Silicon (Si), the patterned hardmask comprises titanium oxide (TiO) or titanium nitride (TiN), the plasma etch gas comprises Sulfur hexafluoride ($SF_6$) gas, and the selective source gas comprises Titanium chloride ($TiCl_4$).

15. The method of claim 14, wherein dissociated Titanium (Ti) from the selective source gas combines with dissociated Fluorine (F) from the plasma etch gas to form the protective cap comprising Titanium fluoride ($TiF_x$).

16. A method of manufacturing a semiconductor device, the method comprising:

forming a patterned hardmask over an underlying target layer on a substrate; and performing plasma fabrication operations in parallel on the patterned hardmask and underlying target layer in a plasma etching chamber using a plasma etch gas and a selective source gas, the plasma fabrication operations including:

forming a protective cap on the patterned hardmask thereby-forming a combined hardmask comprising the patterned hardmask and the protective cap while removing portions of the underlying target layer that are not covered by the patterned hardmask.

17. The method of claim 16, wherein: the combined hardmask has a height that is between 5 nm to approximately 100 nm; and the combined hardmask has a width that is between 5 nm to approximately a 2 μm.

18. The method of claim 16, wherein a pattern variation between the combined hardmask and target layer is less than or equal to three percent (3%), wherein the pattern variation is measured as the difference between a width ($W_h$) at a border between the combined hardmask and the target layer and a width (W) at a bottom of the target layer.

19. The method of claim 16, wherein the plasma etching chamber uses inductively coupled plasma (ICP), capacitively coupled plasma (CCP), or electron cyclotron resonance (ECR) plasma.

20. The method of claim 16, wherein:

the plasma etch gas comprises Florine, Chlorine, or Bromine;

the selective source gas comprises a fluoride, a chloride, or a precursor;

the process temperature is between 0 C to approximately 150 C;

the process pressure is between 1 mtorr to approximately 1 torr;

the source power is between 50 W to approximately 1200 W;

the source power frequency is 13.56 MHz and above;

the bias power is between 0 V to approximately 1200 V;

the bias power frequency is 13.56 MHz and below; and the duty cycle is between 1 and 100%.

* * * * *